United States Patent [19]
Denker

[11] Patent Number: 6,106,213
[45] Date of Patent: Aug. 22, 2000

[54] AUTOMATED DOOR ASSEMBLY FOR USE IN SEMICONDUCTOR WAFER MANUFACTURING

[75] Inventor: Jeffrey M. Denker, Woburn, Mass.

[73] Assignee: PRI Automation, Inc., Billerica, Mass.

[21] Appl. No.: 09/185,222

[22] Filed: Nov. 3, 1998

Related U.S. Application Data

[60] Provisional application No. 60/076,223, Feb. 27, 1998.

[51] Int. Cl.⁷ .................................................. B65G 49/07
[52] U.S. Cl. .......................... 414/411; 414/217; 414/940; 49/276
[58] Field of Search ..................................... 414/217, 411, 414/937, 939, 940; 198/346.1; 49/276, 277; 292/140, 144, 300; 248/500

[56] References Cited

U.S. PATENT DOCUMENTS

| | | | |
|---|---|---|---|
| 4,739,882 | 4/1988 | Parikh et al. | 414/940 X |
| 4,776,744 | 10/1988 | Stonestreet et al. | 414/940 X |
| 5,246,218 | 9/1993 | Yap et al. | 414/940 X |
| 5,586,585 | 12/1996 | Bonora et al. | 414/940 X |
| 5,607,276 | 3/1997 | Muka et al. | 414/940 X |
| 5,615,988 | 4/1997 | Wiesler et al. | 414/416 |
| 5,628,683 | 5/1997 | Gentischer | 414/411 X |
| 5,647,718 | 7/1997 | Wiesler et al. | 414/416 |
| 5,653,565 | 8/1997 | Bonora et al. | 414/411 |
| 5,673,804 | 10/1997 | Weiss et al. | 212/274 |
| 5,683,124 | 11/1997 | Karpisek | 292/140 X |
| 5,741,109 | 4/1998 | Wiesler et al. | 414/416 |
| 5,772,386 | 6/1998 | Mages et al. | 414/411 |
| 5,810,537 | 9/1998 | Briner et al. | 414/940 X |
| 5,829,939 | 11/1998 | Iwai et al. | 414/411 |
| 5,848,933 | 12/1999 | Roberson, Jr. et al. | 414/940 X |

*Primary Examiner*—Gregory A. Morse
*Attorney, Agent, or Firm*—Weingarten, Schurgin, Gagnebin & Hayes LLP

[57] ABSTRACT

An automated door assembly is provided for sealing an opening in a barrier to a contaminant-free environment suitable for semiconductor wafer processing. The door assembly comprises a base pivotable toward and away from the opening along an arcuate path and a closure plate linearly movably coupled to the base and configured to a seal the opening in the barrier. The closure plate is movable in synchronization with the pivoting of the base to traverse a horizontal linear path into contact with the barrier to close the opening. A vacuum system is provided in conjunction with the door assembly to extract particles from the sealed environment. A sensor disposed on the closure plate is operable to sense the position of wafers or other objects disposed adjacent the opening, to detect misalignment or omission thereof. The closure plate can be provided in a number of sizes for interchangeability to accommodate different sized pods; similarly, bezel inserts having different sized openings therein can be provided in the barrier. A latching apparatus for latching a wafer pod or cassette is also provided. The latching apparatus includes a pod support and a platform linearly movably coupled to the pod support. A locking mechanism configured to mate with a corresponding mechanism on the pod is rotatably mounted to the pod support and coupled to the platform for linear motion therewith, such that linear motion of the platform is operative to rotate the locking mechanism into locking engagement with the pod. The platform includes three beveled pins matable with corresponding openings having beveled surfaces on the pod.

3 Claims, 10 Drawing Sheets

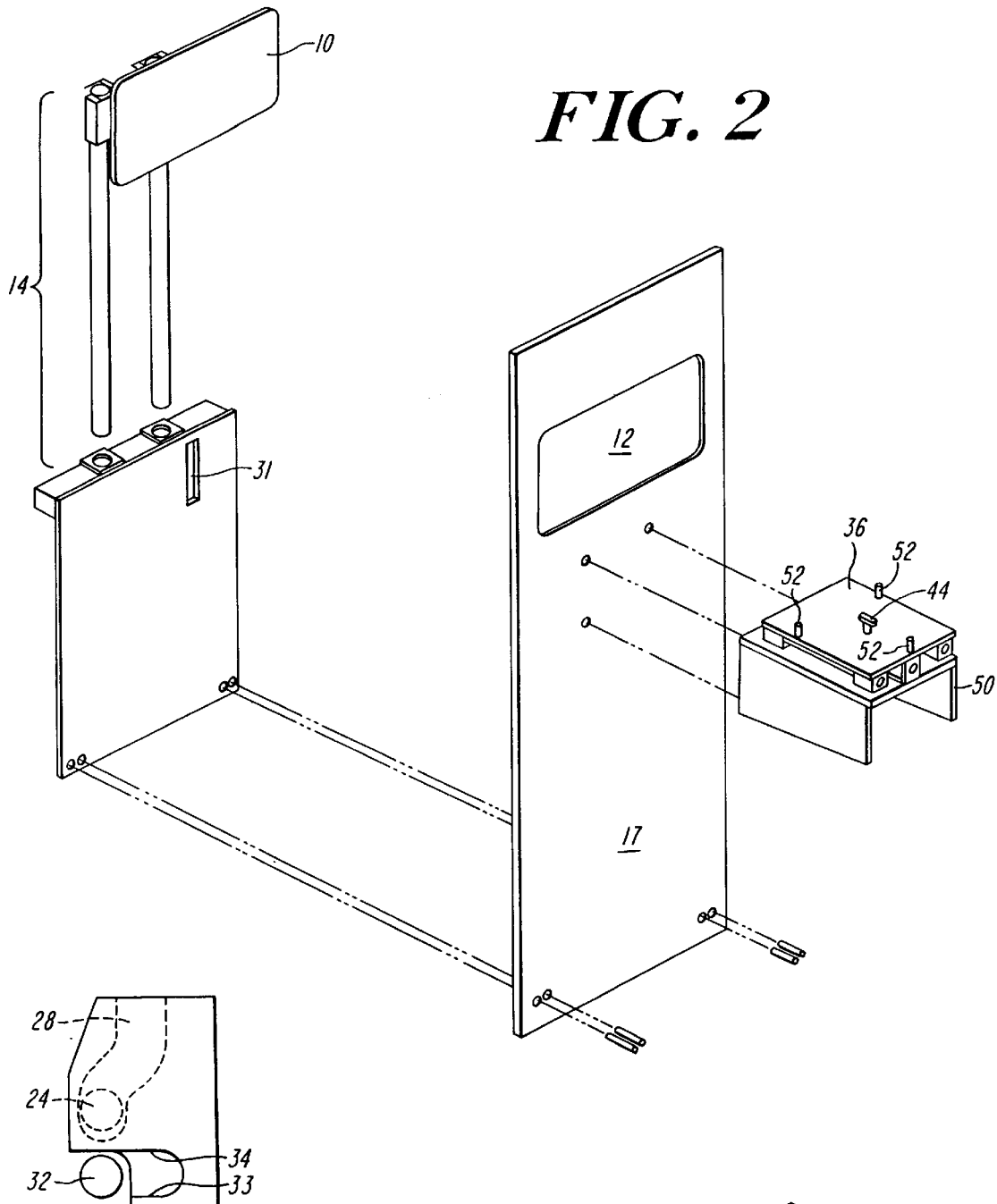
FIG. 2
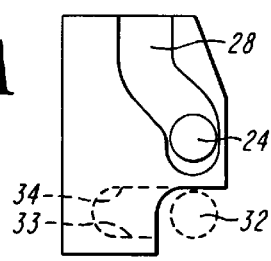
FIG. 3A
FIG. 3B
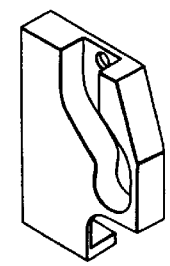
FIG. 3C

AUTOMATED DOOR ASSEMBLY FOR USE IN SEMICONDUCTOR WAFER MANUFACTURING

CROSS REFERENCE TO RELATED APPLICATIONS

Priority is claimed to U.S. Provisional Patent Application Ser. No. 60/076,223, entitled Automated Door Assembly For Use in Semiconductor Wafer Manufacturing, Filed Feb. 27, 1998, the disclosure of which is incorporated herein by reference.

STATEMENT REGARDING FEDERALLY SPONSORED RESEARCH OR DEVELOPMENT

N/A

FIELD OF THE INVENTION

This invention relates to semiconductor fabrication wafer handling apparatus, and specifically to an automated door assembly to provide controlled access to a substantially contaminant free treatment environment for wafers disposed therein.

BACKGROUND

Wafer fabrication operations for producing silicon wafers suitable for use with microprocessors, computer memory, and other microcircuits must be carried out in a substantially contaminant-free environment. Airborne particles such as dust and dirt can compromise the quality of the resulting wafer. Excessive foreign matter results in a lower yield of usable wafers from a particular batch. Increasingly dense arrangement of circuit elements on a wafer, or chip, further heightens the quality required to produce a usable wafer. Accordingly, such fabrication operations are often performed in a sealed, substantially contaminant-free processing environment.

Transport of these wafers to and from such a processing environment requires access through an opening in a wall to a sealed chamber in which wafer processing occurs. This processing Express Mail Number environment, referred to as the tool side of the wall, contains tools and apparatus for effecting such processing. On the side opposite the processing environment, referred to as the operator side of the wall, transport of the wafers between processing stations occurs by human or robotic operators.

The opening in the wall must be capable of being sealed sufficiently by a door assembly to maintain the contaminant-free state on the tool side, but also be readily unsealed to provide expedient and unobstructed access between the operator and tool sides when needed. Such a seal between the door assembly and the opening often involves close tolerances between moving parts, which raises issues of friction and inaccurate sealing, as wear-and-tear affects the seal mechanism.

The wafers are often stored in a sealed cassette called a pod when they are not in the processing environment on the tool side. Such pods are designed to engage and seal against the opening in the wall from the operator side to allow the wafers to be accessed by a mechanism from the tool side while maintaining the separation between the processing environment and the operator side environment. This separation is achieved by abutting the pod in sealing engagement with the operator side of the wall adjacent the opening therein. Then, the pod door is engaged by the door assembly, unlocked from the pod, and drawn by the door assembly into the tool side. In this manner, the outer perimeter of the pod opening remains sealably engaged with the outer perimeter of the opening in the wall. With the pod door engaged by the door assembly and retracted from the pod, the wafers inside the pod are accessible for processing by apparatus on the tool side. After processing, the wafers are returned to the pod and the door assembly is moved to reengage the pod door with the pod, thereby also closing the opening in the wall with the door assembly. Further, the pod must remain undisturbed when the pod door is open to the processing environment, as manipulation of the pod, such as accidental removal, could disturb the seal and cause physical damage to the wafers.

Automation of such a wafer handling and treatment operation is therefore burdened by the need to manipulate the door assembly and pod door within these close tolerances, the need to accurately reengage with and reseal the pod door and wall opening following wafer treatment, and the need to secure the pod during treatment to avoid accidental removal. Movement of a door assembly concealing such an opening, however, is typically along two orthogonal axes. Alternatively, a pivoting mechanism is used to effect movement along a single arcuate path.

SUMMARY OF INVENTION

The present application relates to an automated door assembly and pod latching apparatus for selectively engaging and sealing an opening in a wall which provides access to a substantially contaminant-free environment for wafer processing.

The automated door assembly comprises a base pivotably mounted to a fixed support surface in the sealed environment, and a closure plate linearly movably coupled to the base. The closure plate is configured to seal the opening in the barrier. A closure mechanism is provided comprising a pivoting drive assembly coupled to the base and operable to pivot the base toward and away from the opening along an arcuate path. The closure mechanism also comprises a linear horizontal drive assembly coupled to the closure plate and operable in synchronization with the pivoting drive assembly to force the closure plate to follow a horizontal linear path along an upper portion of the arcuate path of the base adjacent and into contact with the barrier to close the opening. The door assembly also comprises an extendable and retractable arm coupled to the base. The closure plate is disposed on an upper end of the extendable and retractable arm.

When the door assembly is in a fully open position and is not sealed against the opening, the arm is in a retracted position pivoted slightly away from the barrier. As the arm is extended, the closure plate approaches the opening until it reaches a point substantially in front of and obscuring the opening. At this point, the base then pivots inward so that the closure plate approaches the opening on an arcuate path. As the closure plate approaches a position closer to the opening, the linear horizontal drive assembly linearizes the movement of the closure plate. In this manner, the closure plate is directly aligned on a linear path perpendicular to the opening rather than oriented on an arcuate docking path. This engagement provides accurate, effective sealing of the portal door with little force required to overcome friction between the closure plate and the edge of the opening which would otherwise be encountered when moving the closure plate on an arcuate path within close tolerances.

In another embodiment of the invention, a container latching apparatus is provided for latching a container such as a wafer pod or cassette in sealing engagement with the opening on the operator side of the barrier. The container latching apparatus comprises a container or pod support disposed proximate to the opening in the barrier. A platform is linearly movably coupled to the container support. A drive mechanism is coupled to the container support and the platform and is operative to linearly drive the platform with respect to the container support toward and away from the opening in the barrier. A locking mechanism, configured to mate with a corresponding mechanism on the container or pod, is rotatably mounted to the container or pod support and coupled to the platform for linear motion therewith. The platform has mounting pins having beveled upper edges or V-shaped tops for engaging with beveled slots or openings on the underside of the pod to restrict lateral movement of the pod.

After the pod is placed on the platform, the platform is disposed towards the opening and the locking mechanism is rotationally engaged with the corresponding pod locking mechanism to lock the pod. Once engaged with the opening, the closure plate of the door assembly latches onto the pod door, in a manner known in the art, and both are opened enabling the wafers to be processed by various apparatus within the processing environment or tool side. During this time, the pod is secured to the platform by the container latching apparatus, thereby preventing premature removal of the pod, which could lead to wafer damage or contamination of the contaminant-free environment.

In another aspect of the present invention, vertical movement of the closure plate is effected independent of the pivoting movement through the use of a high-resolution servo motor combined with a high-ratio gearbox to drive the extendable portion of the arm via a drive belt. Further, the high-resolution motor works in conjunction with a sensor, such as a optical scanner, provided on the closure plate to sense misplacement of wafers or missing wafers by mapping their location based on motor displacement. Also provided is a closure plate which is readily detachable from the arm, and further, a bezel insert containing the opening to allow the apparatus to accommodate different sized pods by replacing the closure plate and opening bezel insert to correspond to different size pods. In a further aspect of the present invention, the base comprises a closed container having an opening therein. The closure plate is attached to at least one riser extending through the opening. A vacuum assembly is disposed adjacent to the opening and coupled to an ambient environment, such as the operator side or outside, and operable to provide a vacuum around the opening, whereby particles within the closed container are extractable to the ambient environment.

DESCRIPTION OF THE DRAWINGS

FIG. 2 is an isometric exploded view of the automated door opener and pod retraction apparatus from the operator side;

FIG. 3a is a right side view of a door closure cam of the present invention;

FIG. 3b is a left side view of the door closure cam of FIG. 3a;

FIG. 3c is an isometric view of the door closure cam of FIG. 3a;

DETAILED DESCRIPTION OF THE INVENTION

Figure 1:
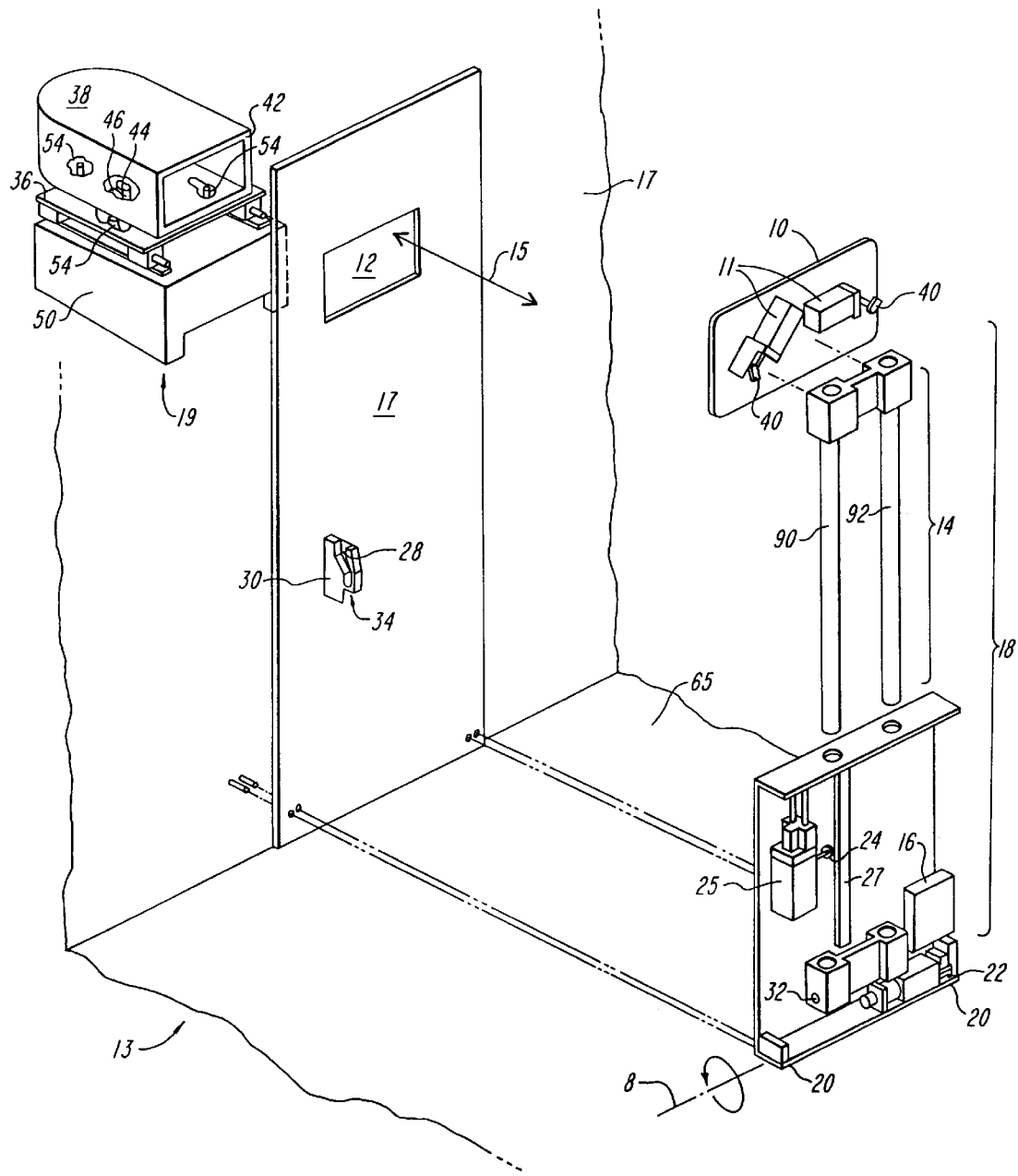
FIG. 1 is an isometric exploded view of the automated door assembly and pod latching apparatus from the tool side.
Figure 4:
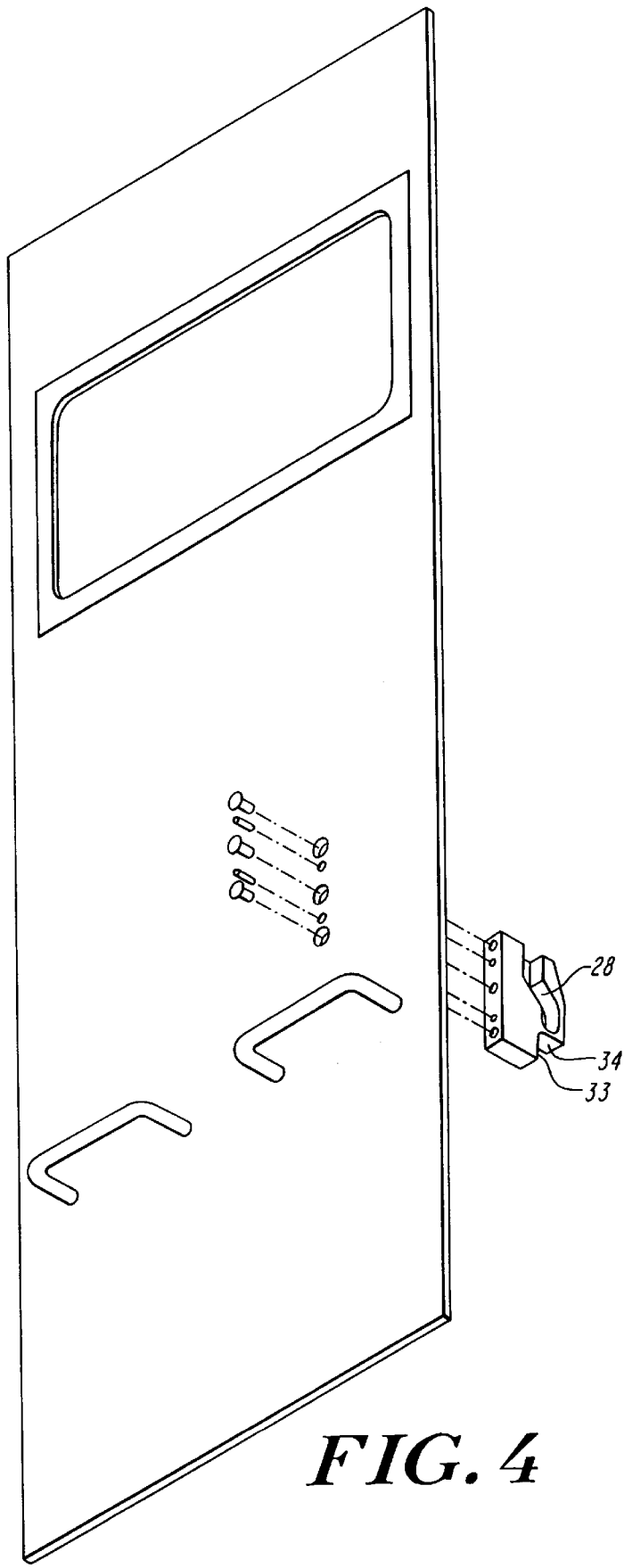
FIG. 4 is an exploded isometric view of a portion of the containment wall between the tool side and the operator side, as seen from the operator side.

Referring to FIGS. 1 & 2, an automated door assembly 18 and pod latching apparatus 19 are disclosed. The door assembly is located on the tool side of a wall 17 separating the tool side from the operator side, and is operable to seal an opening 12 in the wall through which wafers may pass. The wall 17 or a portion thereof may be at an angle of less than 900 with respect to the floor 65, for reasons discussed further below. A pod support 50 of the pod latching apparatus 19 is located on the operator side of the wall 17 for supporting a pod 38. The pod support is operable to position the pod in locking engagement with the opening 12 such that the door assembly 18 is operable to latch onto the pod door, in a known manner, and retract it into the tool side while the opening remains sealed from the operator side by the pod, as described further below.

The door assembly 18 is adapted to be received by the opening 12. Opening 12 is sealed by closure plate 10 when the arm 14 of door assembly 18 is extended and pivoted about axis 8. The door assembly 18 approaches the opening 12 first by extending a closure plate 10 upward toward the opening, then by pivoting the door assembly 18 towards the opening 12 about pivot points 20. Then, as it nears the opening, the closure plate 10 traverses a linear, rather than an arcuate, path until it engages the opening 12 by a mechanism 30 described further below. As pod platform 36 is disposed, rotatable T-shaped latch 44 rotates within oval-shaped pod locking receptacle, securing pod 38 to pod platform 36. Door 10 then engages latch 40 with pod door 42 such that door 10 and pod door 42 can be removed as one unit by closure arm door assembly 18.

Figure 9:
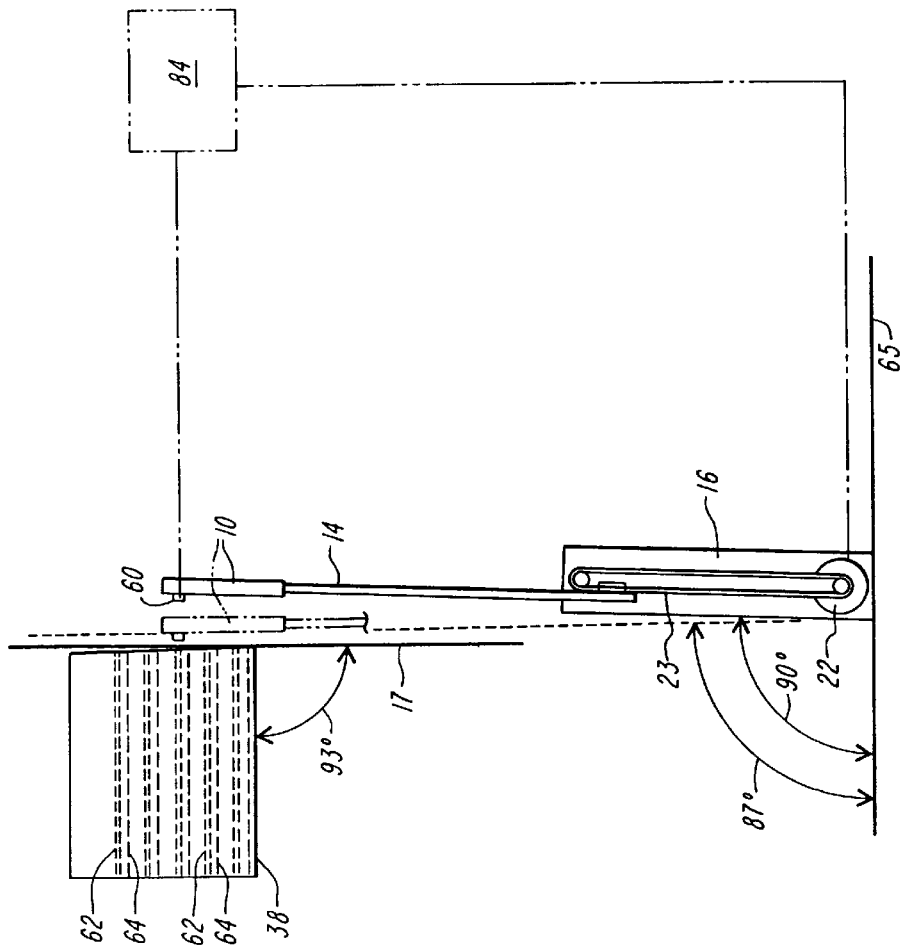
FIG. 9 is a schematic side view of a further embodiment of the present invention illustrating a high-resolution drive mechanism and wafer sensor mechanism.
Figure 8A:
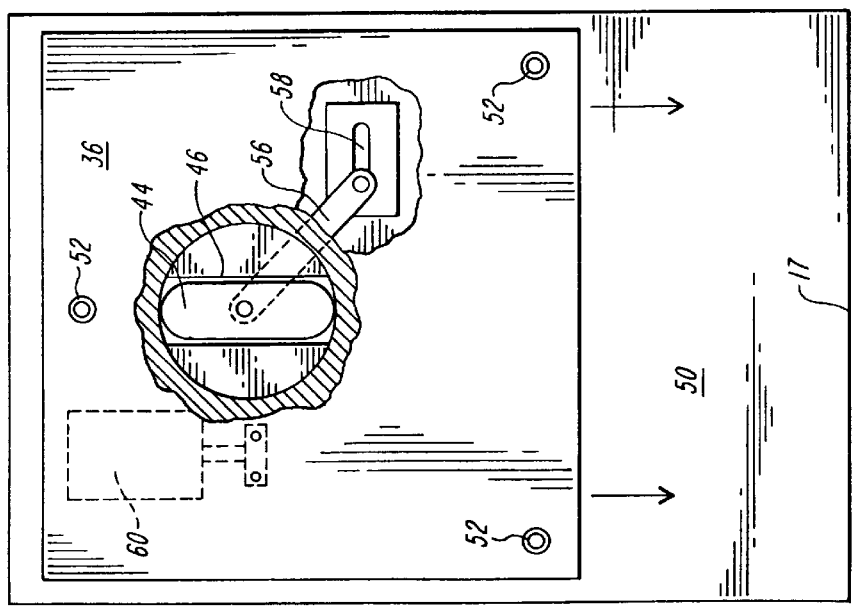
FIG. 8a is a schematic, partially cut-away plan view of the pod support retracted away from the door assembly.
Figure 8C:
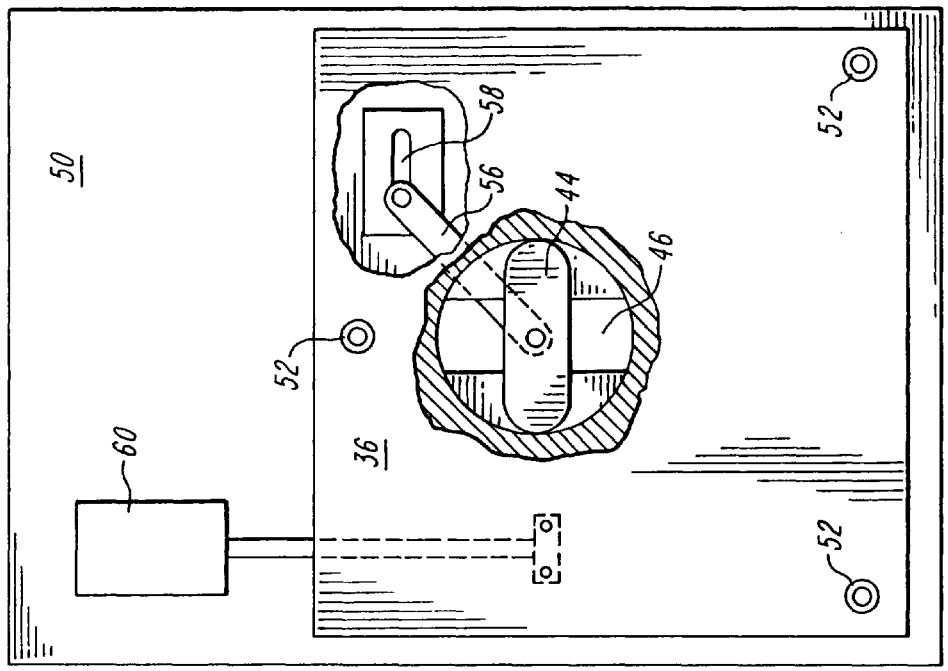
FIG. 8c is a schematic, partially cut-away plan view of the pod platform at the engaged position locking the pod in place.
Figure 8B:
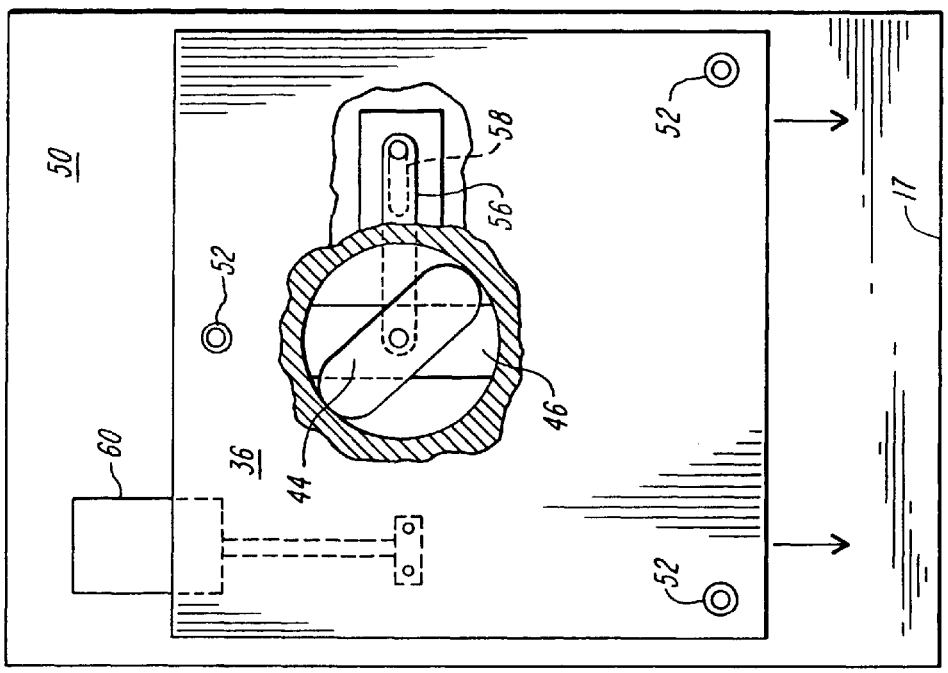
FIG. 8b is a schematic, partially cut-away plan view of the pod support in an intermediate position.

More particularly, the door assembly 18 includes a base 16 and an arm 14 mounted to the base 16 for extension and retraction. The base 16 is mounted for pivoting about a horizontal axis 8 through pivot points 20 at the lower end of the base 16. The closure plate 10 is mounted at an end of the arm 14 opposite the base 16. When the arm 14 is in an extended position, the closure plate 10 is sealable against the opening in the wall 12 to maintain the contaminant free environment on the tool side 13. The closure plate 10 includes a pod door engagement mechanism 11 which is operable to engage the pod door 42. The arm is shown having two tubular risers 90 & 92, although any suitable configuration, such as a single riser or three or more tubular risers, could be provided. Similarly, the arm could be other than tubular, if desired. The arm may be extended and retracted by any suitable mechanism, such as the drive belt 23, linear rail 27, rise drive block 29 and servo motor mechanism 22 as shown in FIGS. 1 & 9. A controller is provided in communication with the motor mechanism to control operation thereof. The tubular risers 90, 92 are inserted into the riser drive block 29.

With the pod door 42 engaged on the closure plate 10, the door assembly 18 is operable to retract the closure plate 10 along a horizontal linear path 15 away from the opening 12. When the closure plate 10 and pod door 42 have sufficiently cleared the opening 12, the door assembly 18 is operable to retract the arm 14, thereby lowering the closure plate 10 and pod door 42 away from the opening and allowing access to the wafers in a pod 38 by the tools on the tool side 13. After processing, the wafers are returned to the pod 38 and the door assembly 18 motions are reversed to close the opening with the closure plate 10 and return the pod door 42 to the pod 38.

Figure 5A:
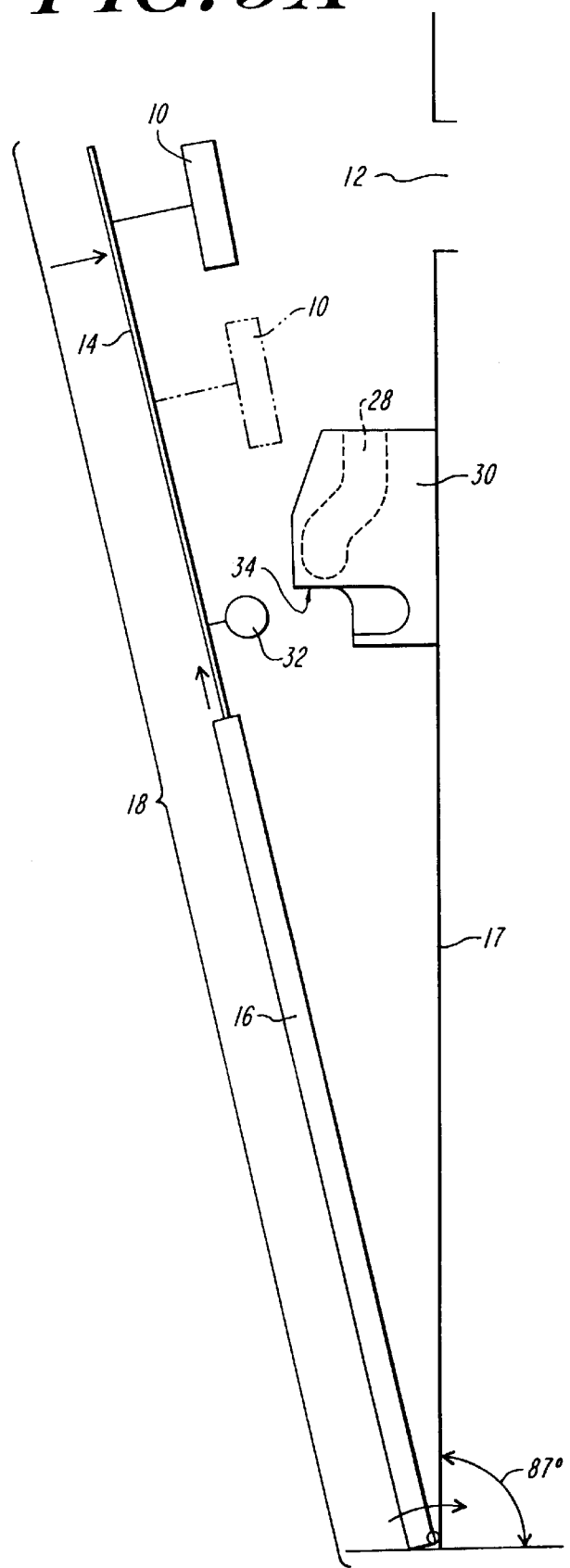
FIG. 5a is a schematic illustration of the automated door assembly in an extended position.
Figure 5B:
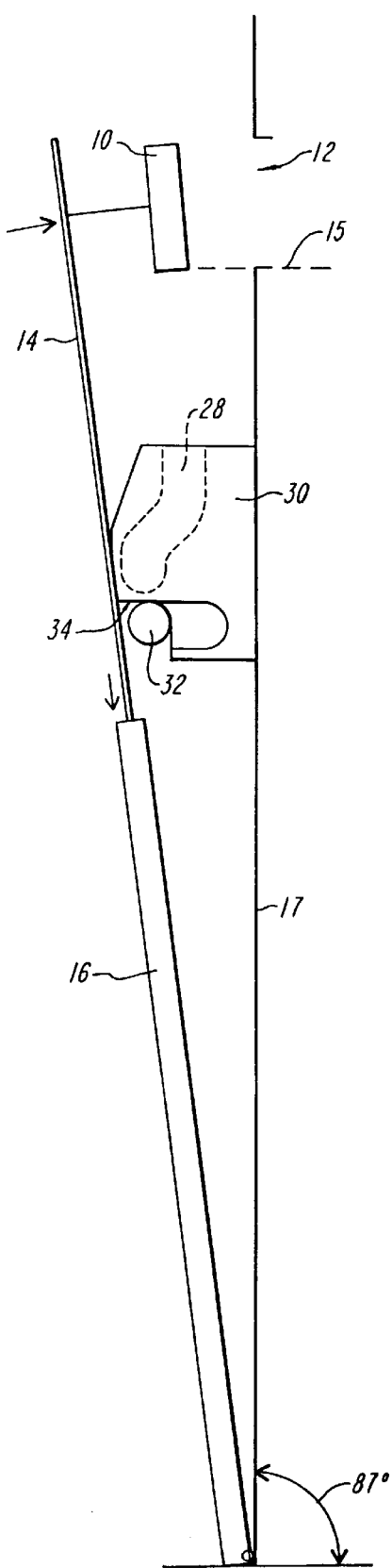
FIG. 5b is a schematic illustration of the automated door assembly in a further extended position.
Figure 5C:
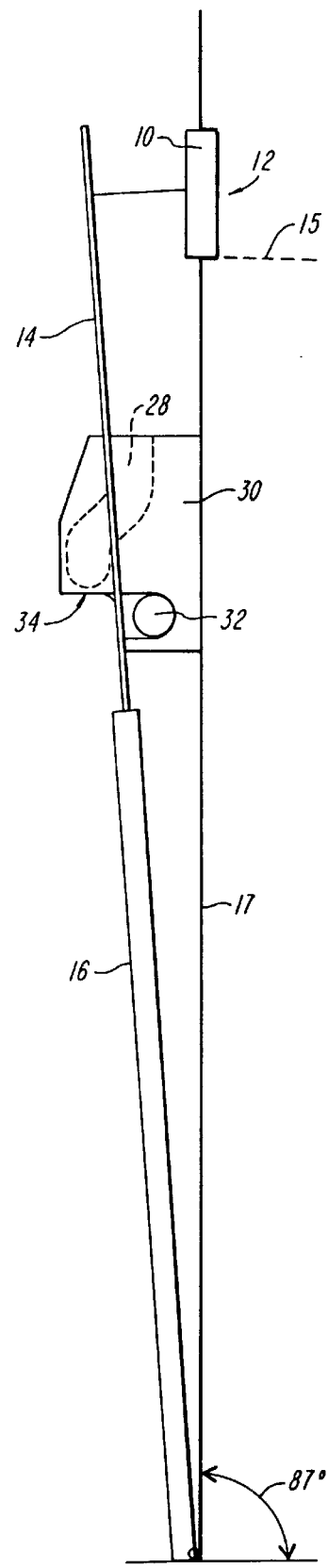
FIG. 5c is a schematic illustration of the automated door assembly in a closed position.

Referring to FIGS. 5a–c, to close the opening in the wall, the arm 14 is extended linearly to move the closure plate 10 upwardly from the base 16. When the closure plate reaches a position close to the opening, the base is pivoted about the horizontal axis 8 to move the closure plate 10 toward the opening 12. At the same time, the arm 14 and closure plate 10 are retracted linearly downward in synchronization with the pivoting motion of the base to effect a substantially horizontal linear motion 15 of the closure plate 10 perpendicular to the wall 17 and the opening therein 12. In this manner, the closure plate seals the opening cleanly without adverse consequences of a vertical component of motion on the perimeter of the opening, thereby minimizing wear on the opening and the closure plate and extending their useful life. When the door assembly is opened, these motions are reversed.

In the preferred embodiment, the horizontal linear motion of the closure plate 10 is achieved by a closure cam mechanism 30. The closure cam mechanism 30 is mounted to or fixed with respect to the wall 17 and extends through a slot 31 or other suitable aperture in the base 16. On one side of the cam mechanism 30 is provided an S-shaped cam surface 28. A horizontal upper cam surface 34 is provided, on the other side of the cam mechanism 30, below the S-shaped cam surface 28. A horizontal cam roller 32 engageable with the horizontal cam surface 34 is mounted to the arm 14. As the arm is extended upwardly, the horizontal cam roller 32 abuts the horizontal cam surface 34 and prevents a further upward component of motion of the arm 14 and closure plate 10.

Figure 6A:
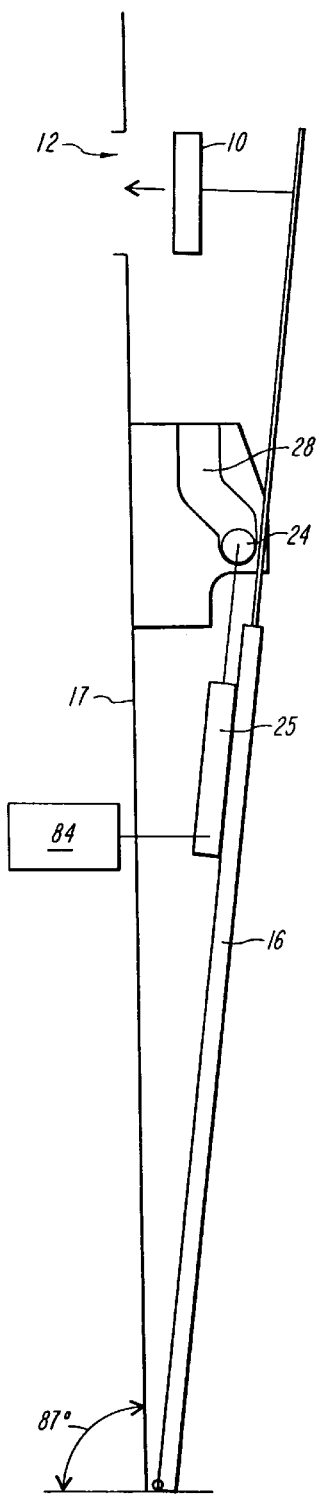
FIG. 6a is a schematic illustration of the automated door assembly in an extended position.
Figure 6B:
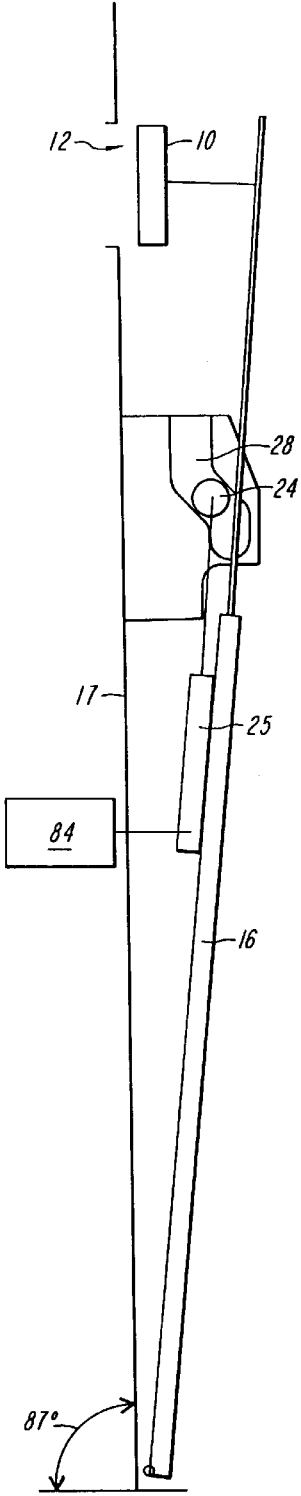
FIG. 6b is a schematic illustration of the automated door assembly in a further extended position.
Figure 6C:
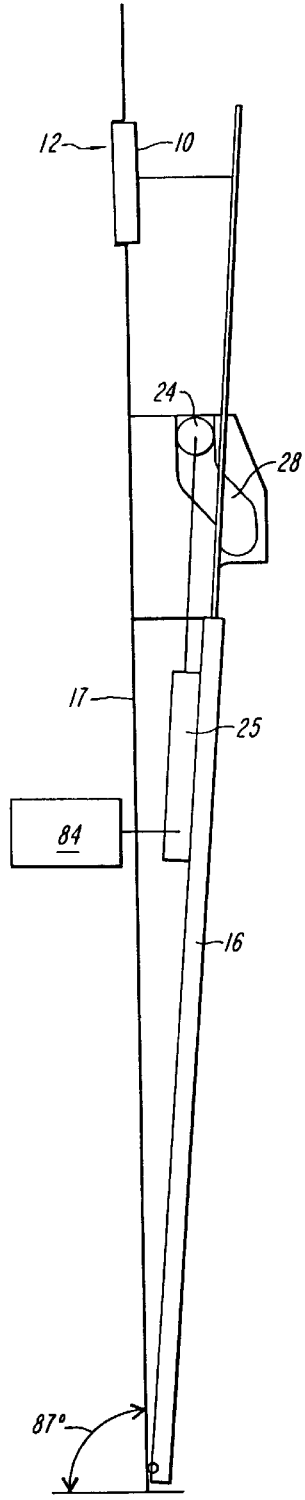
FIG. 6c is a schematic illustration of the automated door assembly in a closed position.
Figure 7:
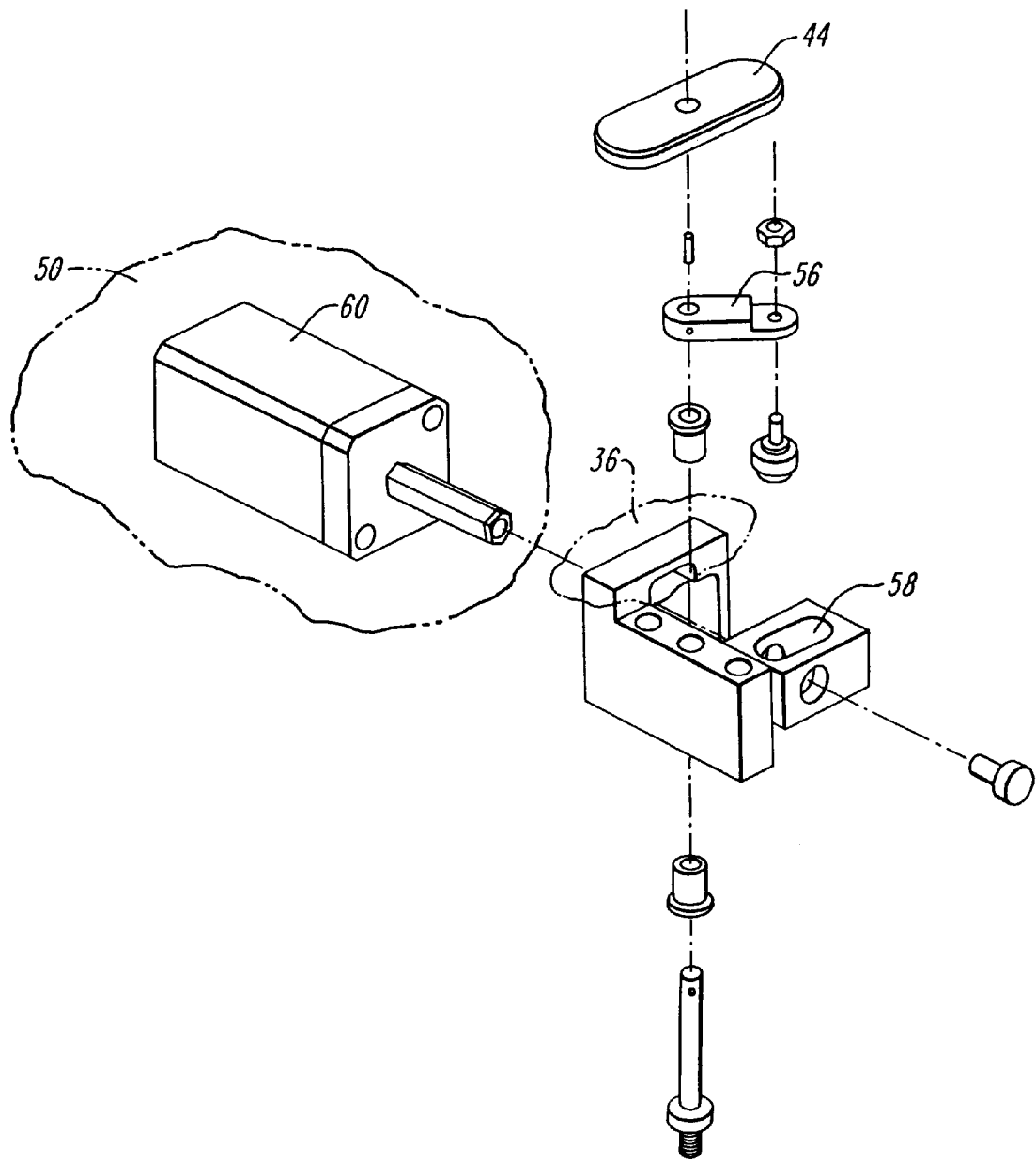
FIG. 7 is an exploded isometric view of a portion of the latch mechanism of the present invention.

Referring to FIGS. 6a–c, a pivot cam roller 24 engaged within the S-shaped cam surface 28 is mounted on the base 16 and in communication with a drive mechanism 25, such as a piston and cylinder operable under the control of the controller 84, which provides upward and downward motion. As the pivot cam roller 24 engages the S-shaped cam surface during upwardly driven motion, the S-shaped cam surface causes the pivot cam roller 24 to move toward the wall 17, thereby driving the door assembly 18 toward the wall by pivoting of the base 16 about its pivot axis 8. Similarly, as the drive mechanism 25 drives the pivot cam roller 24 downwardly, the engagement with the S-shaped cam surface 28 causes the pivot cam roller 24 to move away from the wall 17, thereby moving the door assembly 18 away from the wall by pivoting the base 16 about its pivot axis 8.

In operation, referring to FIGS. 5a–c and 6a–c to close the opening 12, the arm 14 is driven upward. When the closure plate 10 nears the opening 12, the S-cam drive mechanism 25 is actuated to drive the S-cam roller 24 upward to effect pivoting motion of the door assembly 18. As the door assembly pivots inward toward the wall 17, the horizontal cam roller 32 slidably engages the horizontal cam surface 34, thereby preventing any further vertical component of motion of the closure plate 10 and arm 14. As the S-cam roller 24 is continued to be driven upwardly, the closure plate follows a horizontal linear path 15 perpendicular to the wall 17 into engagement with the opening 12 in the wall 17.

The closure plate in effect moves linearly downward with respect to the base a distance sufficient, when synchronized with the arcuate motion of the base, to achieve substantially horizontal linear motion perpendicular to the wall 17. The closure plate can be moved linearly downwardly with respect to the base against the operation of the motor 22, or alternatively the motor 22 can be operated to drive the closure plate downwardly.

The cam mechanism 30 also includes a lower horizontal surface 33 opposite the upper horizontal surface 34, as shown in FIGS. 3, 4 and 5a–c. The horizontal cam roller 32 is engageable with the lower surface 33 when the closure plate 10 is sealed against the opening 12, thereby preventing any vertically downward motion of the closure plate 10. This surface 33 is particularly useful in the event of a power failure to ensure that the closure plate 10 remains sealed against the opening 12 and does not drop away therefrom, potentially damaging the perimeter of the opening and allowing contaminants to enter into the tool side 13.

In a further embodiment of the present invention, a pod locking mechanism is provided. Referring to FIGS. 1, 2, 7, and 8, The pod locking mechanism includes a pod platform 36 on the pod support 50 which is drivable linearly toward and away from the opening 12 in the wall 17. A plurality of upstanding pins 52 are provided which mate with a corresponding plurality of apertures 54 in a bottom surface of the pod. Preferably three pins and apertures are provided since three points are sufficient to locate the pod 38 with respect to the platform 36 without introducing any gap between the pod 38 and the pod platform 36. Additionally, the tops of the pins 52 are beveled, or V-shaped, as are the sides of the apertures to allow the pod to settle on the pins in an appropriate position, thereby allowing for slight variations in the openings 54 and to facilitate placement of the pods on the platform.

Referring to FIGS. 1, 2, 7, and 8, the pod 38 also has an oval aperture 46 or slot in the bottom surface. The pod platform 36 includes a T-shaped latch 44 which is rotationally mounted to the underside of the platform. A pivoting link 56 is attached to the latch 44 at one end. An opposite end of the link is retained in pivoting and slidable communication with a linear slot 58 in the pod support 50 disposed orthogonally to the direction of liner motion of the platform 36. As the platform is driven toward the opening 12 by drive mechanism 60, carrying the latch 44 with it, the link 56 is caused to travel within the slot 58, effecting rotational movement of the latch as indicated sequentially in FIGS. 8a–c. Following placement of the pod 38 on the pod platform 36, the upper portion of the T-shaped latch 44 extends through the slot in the pod 46 such that, as the latch is rotated, the outer ends of the upper portion rotate out of alignment with the slot 46 to secure the pod 38 to the pod platform 36. In this manner, simple linear movement of the pod platform is used to additionally provide the latching of the pod to the pod platform. To remove the pod from the pod platform, the platform is driven away from the opening 12 in the wall, thereby reversing movement of the T-shaped latch 44 until it aligns with the slot 46 in the pod. At this point, the pod 38 can be freely lifted off the platform 36.

Referring to FIG. 9, a sensor 60 in communication with the controller 84 is shown attached to the closure plate 10. In the preferred embodiment, sensor 60 is an optical device for detecting wafers positioned in the pod on opposing, coplanar ridges 62 mounted on the interior side of the pod 38. As the arm 14 is moved downwardly by the belt 23 in communication with servo motor 22, the sensor 60 is similarly driven downwards. Sensor position can then be accurately determined by the controller by belt displacement 16 derived from the number of rotations of the motor 22. Sensor 60 detects the position of wafers 64 resting on ridges 62. In accordance with the preferred embodiment, the retracted position of the arm 14 is vertical and perpendicular to the floor 65, while the wall 17 is slightly angled outward from the upper end of the arm 14 as indicated by angle E, and in the preferred embodiment is approximately 87°, although the exact angle is not critical. Ridges 62 and therefore, wafers 64, are likewise perpendicular to the retracted position of the arm 14. This perpendicular orientation of the retracted arm insures that wafers 64 are a uniform distance from sensor 60 throughout the travel path across the open pod 38. Therefore, the topmost wafer in the pod 38 is the same distance from sensor 60 as the bottom wafer. Missing and uneven (mounted on non-coplanar ridges) wafers can therefore be detected by comparison of belt displacement to predetermined ridge heights within the pod 38.

Figure 10:
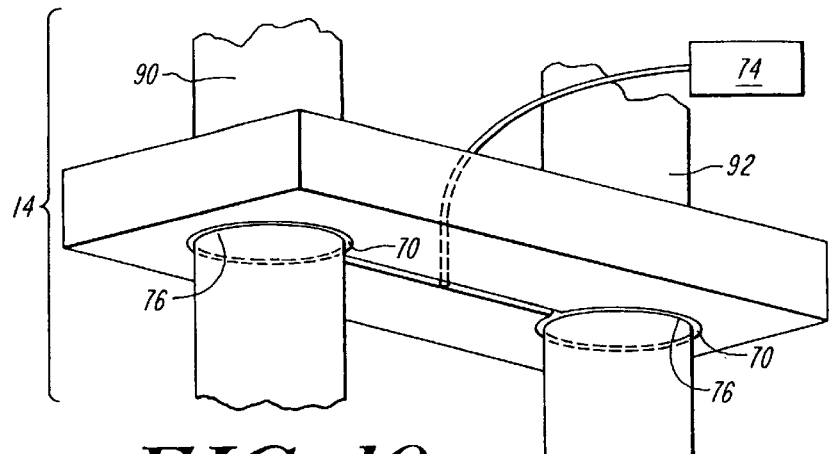
FIG. 10 is a schematic isometric view of a further embodiment illustrating vacuum tubes around the door support tubes.
Figure 11A:
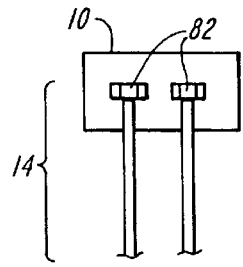
FIGS. 11a & b are schematic views of a further embodiment illustrating interchangeable closure plates.
Figure 11B:
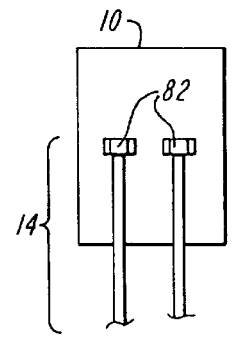
Figure 12A:
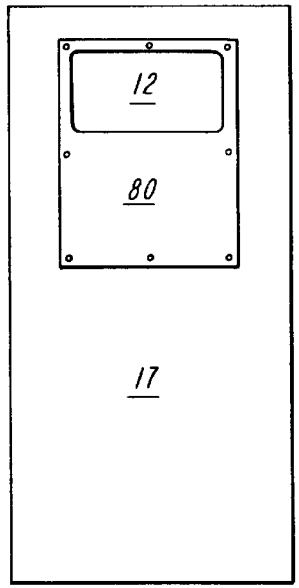
FIGS. 12a & b are schematic views of the interchangeable door bezels for accommodating different closure plates of FIGS. 11a & b.
Figure 12B:
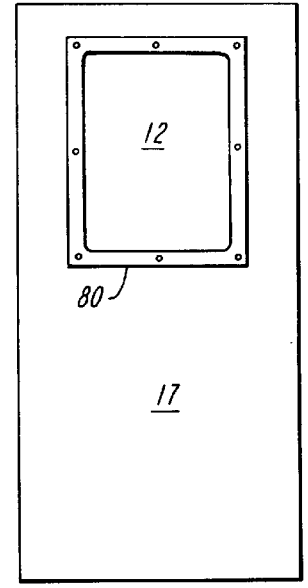

Referring to FIG. 10, a further measure is provided towards ensuring that the door assembly 18 does not permit contaminants to pass during door operation. Arm 14 is comprised of two hollow riser tubes 90, 92 which are extended from the base 16 through apertures 76 in the top side of the base 16. Due to low pressure in the closure assembly 18 which occurs as the arm risers 90, 92 are driven upwards, particles will tend to be drawn into the base 16. Thus, a narrow tolerance is maintained between apertures 76 and arm riser tubes 90 and 92. A vacuum ring tube 70 powered by external vacuum source 74 through vacuum tube 72 is located surrounding each aperture 76. These vacuum rings serve to extract particles which occur as a result of abrasion around the narrow tolerance between the apertures 76 and the arm risers 90, 92 to an ambient environment, such as the operator side or outside.

Referring to FIGS. 1, 11a & 11b and 12a & 12b, an interchangeable closure plate 10 and opening 12 are disclosed. As the size of the opening 12 must be matched to the pod 38 to be processed, alternate sized pods could not be addressed by a single door assembly. Opening 12 is mounted in wall 17 through a bezel plate 80. A plurality of bezel plates 80 having consistent outer dimensions but varying openings 12 can be interchanged among their mounting in respective walls 17. Further, a plurality of closure plates 10 have a mounting bracket 82 which attaches to closure arms 14 consistently but having varying outer dimensions to match a corresponding opening 12 in a particular bezel plate 80. Therefore, a particular door closure mechanism 18 could be adapted to address varying sized pods 38 by merely exchanging bezel plate 80 and closure plate 10 with a pair corresponding to the pod size to be serviced.

Other mechanisms to achieve the pivoting motion of the base and the horizontal linear path of the closure plate can be provided. For example, the horizontal motion of the closure plate can be decoupled from the pivoting motion of the base, such as by driving the closure plate downwardly with the motor 22 under control of the controller 84. In another variant, a drive mechanism which provides rotary motion of the base about the axis 8 can be used, rather than a mechanism which uses linear motion and suitably configured cam surfaces to achieve the pivoting motion.

It should be understood that the invention is not limited to the particular embodiments shown and described herein, and that various changes and modifications may be made without departing from the spirit and scope of the present invention as defined by the following claims.

What is claimed is:

1. A container latching apparatus for latching a container in sealing engagement with an opening in a barrier, the container having a shell and a door, the door removable to reveal an opening in the shell, the container latching apparatus comprising:

a container support disposed proximate to the opening in the barrier;

a platform linearly movably coupled to the container support;

a drive mechanism coupled to the container support and the platform and operative to linearly drive the platform with respect to the container support toward and away from the opening in the barrier; and a locking mechanism rotatably mounted to the container support and coupled to the platform so as to be rotated by linear motion therewith, the locking mechanism configured to mate with a corresponding mechanism on the container.

2. The container latching apparatus of claim 1, wherein the locking mechanism comprises a T-shaped element having an elongated upper member extending above the platform and the corresponding mechanism on the container comprises an elongated slot shaped to receive the elongated upper member.

3. The container latching apparatus of claim 2, further comprising a link having a first end rotatably mounted to the T-shaped element and a second end disposed for linear motion in a slot in the container support, the slot extending normal to the linear motion of the platform.

* * * * *

UNITED STATES PATENT AND TRADEMARK OFFICE
CERTIFICATE OF CORRECTION

PATENT NO.   : 6,106,213
DATED        : August 22, 2000
INVENTOR(S)  : Jeffrey M. Denker It is certified that error appears in the above-identified patent and that said Letters Patent is hereby corrected as shown below:

Column 1,
Line 41, "Express Mail Number environment,", should read -- environment, --;

Column 4,
Line 44, "900", should read -- 90° --;
Line 67, "closure arm door assembly", should read -- door assembly --;

Column 5,
Line 13, "such 5 as", should read -- such as --;
Line 17, "linear rail 27, rise drive", should read -- rise drive --; and Column 7,
Line 32, "E", should read -- θ --.

Signed and Sealed this

Seventh Day of August, 2001

Attest:

NICHOLAS P. GODICI
Attesting Officer   Acting Director of the United States Patent and Trademark Office